United States Patent
Chida

(10) Patent No.: US 7,915,883 B2
(45) Date of Patent: Mar. 29, 2011

(54) CONSTANT CURRENT CIRCUIT, LIGHT EMITTING APPARATUS AND POWER SUPPLY APPARATUS USING THAT CONSTANT CURRENT CIRCUIT

(75) Inventor: Taisuke Chida, Kyoto (JP)

(73) Assignee: Rohm Co., Ltd. (JP)

( * ) Notice: Subject to any disclaimer, the term of this patent is extended or adjusted under 35 U.S.C. 154(b) by 557 days.

(21) Appl. No.: 11/795,773

(22) PCT Filed: Jan. 19, 2006

(86) PCT No.: PCT/JP2006/300699
§ 371 (c)(1),
(2), (4) Date: May 7, 2008

(87) PCT Pub. No.: WO2006/077909
PCT Pub. Date: Jul. 27, 2006

(65) Prior Publication Data
US 2009/0121653 A1 May 14, 2009

(30) Foreign Application Priority Data
Jan. 20, 2005 (JP) .................................. 2005-012986

(51) Int. Cl.
*G05F 3/16* (2006.01)
(52) U.S. Cl. .................... 323/315; 315/307; 327/538
(58) Field of Classification Search .... 315/169.1–169.3, 315/224, 291, 307, 312, 360; 327/108, 109, 327/538; 323/311, 312, 315; 345/82, 46, 345/102
See application file for complete search history.

(56) References Cited

U.S. PATENT DOCUMENTS

| | | | | |
|---|---|---|---|---|
| 5,861,681 | A * | 1/1999 | Nakano et al. | 307/10.1 |
| 6,956,408 | B2 * | 10/2005 | Schrodinger et al. | 315/291 |
| 6,975,162 | B2 * | 12/2005 | Tamura et al. | 323/312 |
| 6,980,181 | B2 * | 12/2005 | Sudo | 345/82 |
| 7,609,098 | B2 * | 10/2009 | Bergmann | 327/108 |

FOREIGN PATENT DOCUMENTS

JP 61-18231 1/1986
(Continued)

OTHER PUBLICATIONS

Chinese Office Action for Chinese Patent Application No. 200680001512.3 issued Mar. 27, 2009 with English Translation.
(Continued)

*Primary Examiner* — Jacob Y Choi
*Assistant Examiner* — Ephrem Alemu
(74) *Attorney, Agent, or Firm* — Cantor Colburn LLP

(57) ABSTRACT

In a constant current circuit that supplies a constant current Ic to a circuit connected to a current output terminal, the first transistor M1 is disposed on a current path of the constant current Ic. The second transistor and the first transistor have commonly connected gate terminals which are control terminals. The first current-voltage converting unit converts the current Im2 flowing through the second transistor into a voltage. A constant current source generates a reference current Iref. The second current-voltage converting unit converts the reference current into a voltage. Into the first error amplifier, voltages Vx1, Vx2 are input, so as to adjust the gate voltage of the first and second transistors. A voltage adjusting unit adjusts the voltage at the gate terminal of the third transistor so that the voltage at one end of the second transistor will be approximated to a predetermined reference voltage.

15 Claims, 5 Drawing Sheets

100

200

FOREIGN PATENT DOCUMENTS

| | | |
|---|---|---|
| JP | 4-86907 | 3/1992 |
| JP | 2004-22929 | 1/2004 |
| JP | 2004-248014 A | 9/2004 |

OTHER PUBLICATIONS

International Search Report for International Application No. PCT/JP2006/300699 mailed Feb. 21, 2006.

International Preliminary Report on Patentability for International Application No. PCT/JP2006/300699 mailed Jul. 24, 2007.

Chinese Office Action for Chinese Application No. 200680001512.3 issued Sep. 19, 2008 with English Translation.

Japanese Office Action for Japanese Patent Application No. 2005-012986 dispatched Oct. 12, 2010 with English translation.

* cited by examiner

100

CONSTANT CURRENT CIRCUIT, LIGHT EMITTING APPARATUS AND POWER SUPPLY APPARATUS USING THAT CONSTANT CURRENT CIRCUIT

BACKGROUND OF THE INVENTION

1. Field of the Invention

The present invention relates to a constant current circuit that generates a predetermined constant electric current.

2. Description of the Related Art

In small information terminals such as a portable phone and a PDA (Personal Digital Assistance) of recent years, there are devices that require a voltage higher than the output voltage of the battery such as a light-emitting diode (Light Emitting Diode, hereinafter referred to as a LED) used as a back light of a liquid crystal, for example. In these small information terminals, a Li ion battery is often used, and the output voltage thereof is typically about 3.5 V, and is about 4.2 V in the fully charged state. However, the LED requires a voltage higher than the battery voltage as the driving voltage thereof. In this manner, when a voltage higher than the battery voltage is required, the battery voltage is boosted with use of a power supply apparatus of boosting type using a switching regulator, a charge pumping circuit, or the like, thereby to obtain a voltage needed for driving a load circuit such as a LED.

In driving the LED with such a power supply apparatus, a constant current circuit is connected on a path for driving the LED and, by keeping the electric current flowing through the LED to be constant, the control of the luminescence brightness thereof is stabilized. At this time, there are cases in which a method is adopted such that the voltage at the connection point of the LED and the constant current circuit is monitored, and the driving voltage of the LED is generated so that this voltage will be a constant value (See Patent Document 1).
[PATENT DOCUMENT 1] Japanese Patent Application Laid-Open (JP-A) No. 2004-22929

Here, in order to achieve stable operation of the constant current circuit connected to the cathode terminal of the LED, the transistor constituting the constant current circuit must operate in a constant current region. Here, the constant current region of a transistor refers to an active region in the case of a bipolar transistor, and refers to a saturation region in the case of a field effect transistor (hereinafter referred to as FET). The transistor constituting the constant current circuit is disposed in series between the cathode terminal of the LED and the grounded terminal. In order that this transistor may operate in the constant current region, the cathode terminal of the LED must be kept at a constant voltage or above.

Assuming that the voltage needed for stable operation of the constant current circuit is Vcs and the current flown through the LED is Iled, an electric power of Pcs=Vcs×Iled is consumed in this constant current circuit. Since the current flown through the LED is a value determined by the luminescence brightness of the LED, the voltage Vcs needed for stable operation of the constant current circuit must be lowered in order to reduce the electric power consumed in the constant current circuit.

SUMMARY OF THE INVENTION

The present invention has been made in view of these problems, and a general purpose thereof is to provide a constant current circuit capable of operating at a low voltage as well as a power supply apparatus and a light-emitting apparatus using the same.

One embodiment of the present invention relates to a constant current circuit that flows a constant current through a circuit connected to a current output terminal. This constant current circuit includes a first transistor disposed on a current path of the constant current; a second transistor having a control terminal connected in common to that of the first transistor; a first current-voltage converting unit that converts a current flowing through the second transistor into a voltage; a constant current source that generates a reference current; a second current-voltage converting unit that converts the reference current into a voltage; and a first error amplifier that receives an input of respective output voltages of the first and second current-voltage converting units, so as to adjust a voltage of the control terminals of the first and second transistors.

The control terminal of a transistor refers to a gate terminal in the case of a FET (Field Effect Transistor), and refers to a base terminal in the case of a bipolar transistor.

According to this embodiment, the voltage of the control terminals of the first and second transistors performs a feedback control by the first error amplifier so that the voltages respectively output from the first and second current-voltage converting units will be approximated to each other. As a result of this, a constant current proportional to the reference current flows through the first transistor, whereby a constant current proportional to the reference current can be flown through the circuit connected to the current output terminal.

The constant current circuit may further include a voltage adjusting unit that is connected to one end of the second transistor to adjust so that a voltage at the one end of the second transistor will be approximated to a predetermined reference voltage.

By fixing the voltage at one end of the second transistor to the reference voltage, a stable constant current can be generated.

The voltage adjusting unit may include a third transistor connected in series to the second transistor; and a second error amplifier that receives an input of a voltage of a connection point of the second and third transistors and the predetermined reference voltage, so as to adjust a voltage of a control terminal of the third transistor.

By constructing a three-terminal regulator with the third transistor and the second error amplifier, the voltage at one end of the second transistor can be fixed to the reference voltage.

The predetermined reference voltage may be set to be identical to a voltage of the current output terminal.

At this time, the voltage of the current output terminal will be equal to the predetermined reference voltage, so that the three terminals of the first and second transistors will have an equal electric potential, whereby the constant current can be generated with a good precision.

The predetermined reference voltage may be set so that the second transistor may operate in a non-constant current region.

In the present specification, the non-constant current region refers to a region where the flowing current changes when the voltage across the two ends of a transistor is changed. The non-constant current region refers to a non-saturation region in the case of a FET, and refers to a saturation region in the case of a bipolar transistor.

When all of the three terminals of the first and second transistors have an equal electric potential, both of the first and second transistors will operate in a non-constant current region, so that the first transistor can generate, with a good precision, a current proportional to the current flowing through the second transistor. By operating the first and second transistors in a non-constant current region, namely in a state in which the voltage across the two ends of the first and second transistors is low, the power consumption can be reduced.

Another embodiment of the present invention is a power supply apparatus. This power supply apparatus includes a constant current circuit described above and a voltage generating unit that supplies a driving voltage to a load circuit connected to the current output terminal of the constant current circuit. The voltage generating unit generates the driving voltage so that a voltage appearing at the current output terminal of the constant current circuit as a result of driving the load circuit may be approximated to a voltage at one end of the second transistor.

According to this embodiment, the voltage generating unit generates the driving voltage so that all of the voltages at the three terminals of the first and second transistors will be equal, so that the load circuit can be driven at a high efficiency.

Still another embodiment of the present invention is a light-emitting apparatus. This light-emitting apparatus includes a light-emitting element and a power supply apparatus described above that drives the light-emitting element. The power supply apparatus controls the luminescence brightness of the light-emitting element with use of the reference current that is generated by the constant current source of the constant current circuit.

The light-emitting element refers to a LED, an organic EL (Electro Luminescence), or the like.

According to this embodiment, the brightness of the light-emitting element can be adjusted with use of the reference current, and the driving voltage of the light-emitting element can be generated at a high efficiency.

It is to be noted that any arbitrary combination or rearrangement of the above-described structural components and so froth is effective as and encompassed by the present embodiments.

Moreover, this summary of the invention does not necessarily describe all necessary features so that the invention may also be a sub-combination of these described features.

BRIEF DESCRIPTION OF THE DRAWINGS

Embodiments will not be described, by way of example only, with reference to the accompanying drawings which are meant to be exemplary, not limiting, and wherein like elements are numbered alike in several Figures, in which.

DETAILED DESCRIPTION OF THE INVENTION

The invention will not be described based on preferred embodiments which do not intend to limit the scope of the present invention but exemplify the invention. All of the features and the combinations thereof described in the embodiment are not necessarily essential to the invention.

First Embodiment

Figure 1:
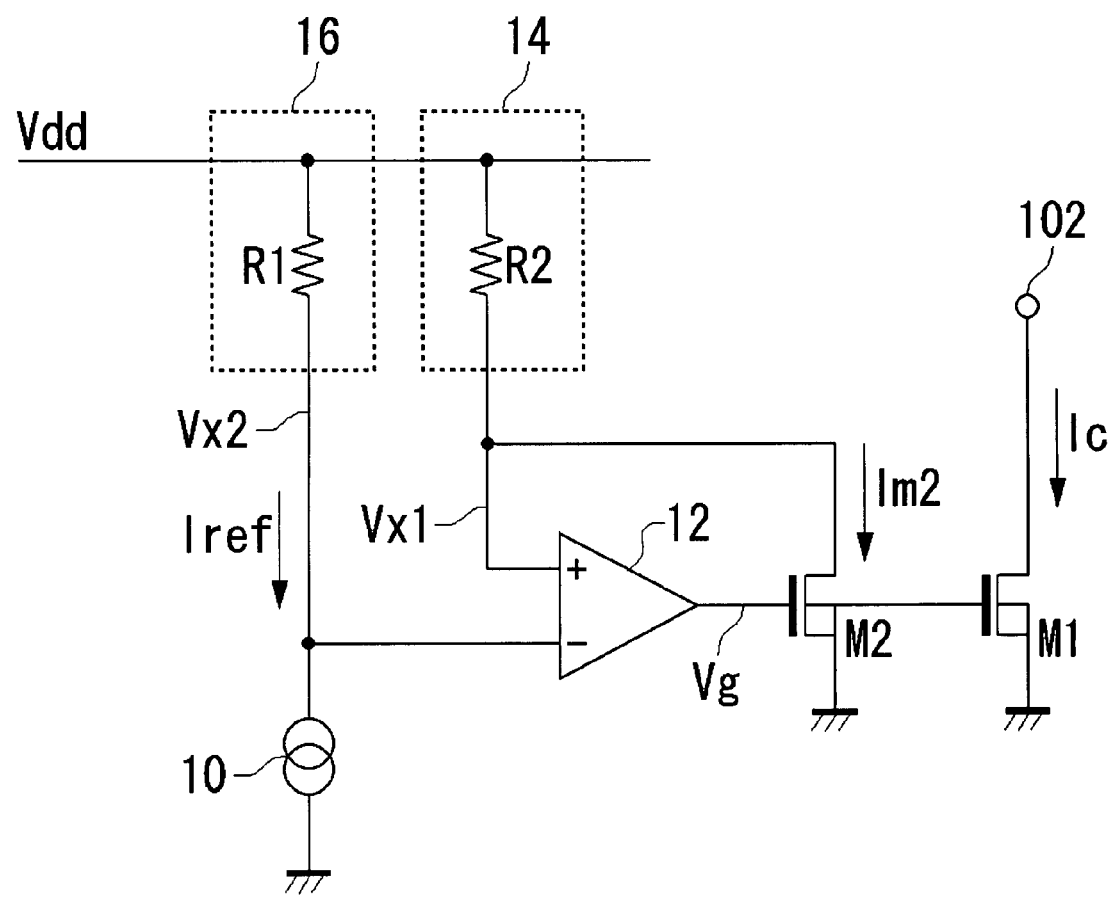
FIG. 1 is a circuit diagram showing a construction of a constant current circuit according to the first embodiment.

FIG. 1 is a circuit diagram showing a construction of a constant current circuit 100 according to the first embodiment of the present invention.

This constant current circuit 100 generates a constant current Ic, and flows the constant current Ic through a circuit connected to a current output terminal 102.

The constant current circuit 100 includes a first transistor M1, a second transistor M2, a constant current source 10, a first error amplifier 12, a first current-voltage converting unit 14, and a second current-voltage converting unit 16.

The first transistor M1 is a MOSFET of N-type, and is disposed on a current path of the constant current Ic. The source terminal of the first transistor M1 is grounded, and the drain terminal is connected to the current output terminal 102. Through the first transistor M1, the constant current Ic serving as an output of the constant current circuit 100 flows.

The second transistor M2, which is a MOSFET of N-type in the same manner as the first transistor M1, has a gate terminal and a source terminal which are connected in common to those of the first transistor M1, and is constructed so that a current according to the size ratio of each transistor may flow. Hereinafter, a transistor pair constructed in this manner will be referred to as a current mirror. The current flowing through the second transistor M2 will be referred to as Im2, and the size ratio of the first transistor M1 and the second transistor M2 is assumed to be S1:S2.

The first current-voltage converting unit 14 includes a second resistor R2. One end of the second resistor R2 is connected to the drain terminal of the second transistor M2, and a fixed voltage Vdd is applied to the other end of the second resistor R2. Through the second resistor R2, the current Im2 flowing through the second transistor M2 flows, whereby a voltage drop of R2×Im2 is generated. The output voltage Vx1 of the first current-voltage converting unit 14 will be Vx1=Vdd−R2×Im2. In this manner, the first current-voltage converting unit 14 converts the current Im2 flowing through the second transistor M2 into the voltage Vx1.

The constant current source 10 generates a reference current Iref. The second current-voltage converting unit 16 includes a first resistor R1. One end of the first resistor R1 is connected to the constant current source 10, and the fixed voltage Vdd is applied to the other end of the first resistor R1. Through the first resistor R1, the reference current Iref generated by the constant current source 10 flows, whereby a voltage drop of R1×Iref is generated. The output voltage Vx2 of the second current-voltage converting unit 16 will be Vx2=Vdd−R1×Iref.

In this manner, the second current-voltage converting unit 16 converts the reference current Iref into the voltage Vx2.

The output voltage Vx1 of the first current-voltage converting unit 14 is input into the non-inverting input terminal of the first error amplifier 12, and the output voltage Vx2 of the second current-voltage converting unit 16 is input into the inverting input terminal of the first error amplifier 12. The output terminal of the first error amplifier 12 is connected to the gate terminals of the first transistor M1 and the second transistor M2, whereby the gate voltage Vg is adjusted on the basis of the voltages Vx1 and Vx2.

An operation of the constant current circuit 100 constructed in the above manner will be described.

The first error amplifier 12, the second transistor M2, and the first current-voltage converting unit 14 forms a feedback loop, and the voltage Vx1 changes in accordance with the output voltage of the first error amplifier 12, namely, the gate voltage Vg of the second transistor M2.

As a result of this, the first error amplifier 12 performs feedback control on the voltage Vg of the gate terminal Vg of the second transistor M2 so that the voltages Vx1, Vx2 applied to the non-inverting input terminal and the inverting input terminal will be equal to each other. In other words, the gate voltage Vg of the second transistor M2 is adjusted so that Vdd−R1×Iref=Vdd−R2×Im2 holds. At this time, the current Im2 flowing through the second transistor M2 is given by Im2=R1/R2×Iref.

Since the first transistor M1 and the second transistor M2 constitutes a current mirror circuit whose gate terminals and the source terminals are connected in common, a current proportional to the current Im2 flowing through the second transistor M2 flows through the first transistor M1. Since the size ratio of the first transistor M1 and the second transistor M2 is S1: S2, a constant current given by Ic=Im2×S1/S2=R1/R2×S1/S2×Iref flows through the first transistor M1.

With use of the constant current circuit 100 according to the present embodiment, a desired constant current can be generated by adjusting the reference current Iref, the resistance values R1, R2, and the size ratio S1, S2 of the transistors, and the constant current Ic can be flown through a circuit connected to the current output terminal 102.

Further, the constant current circuit 100 according to the present embodiment produces the following effects.

Generally, the current flowing through an N-type MOSFET increases according as the gate voltage Vg is set to be higher. However, since the voltage of the gate terminal does not become so high in a typical current mirror circuit in which the gate terminal of the transistor on the input side is connected to the drain terminal, the performance of the transistor on the output side cannot be fully exhibited.

In the constant current circuit 100 according to the present embodiment, by setting the resistance value of the second resistor R2 to be low, the gate voltage Vg of the first transistor M1 and the second transistor M2 can be set to be high, so that the performance of the transistor can be completely drawn out. This means that, even if the transistor size is small, more current can be flown, so that the size of the constant current circuit 100 can be reduced.

Second Embodiment

A constant current circuit 200 according to the second embodiment further includes a voltage adjusting unit 20 that fixes the voltage of the drain terminal of the second transistor M2 in addition to the constant current circuit 100 according to the first embodiment.

Figure 2:
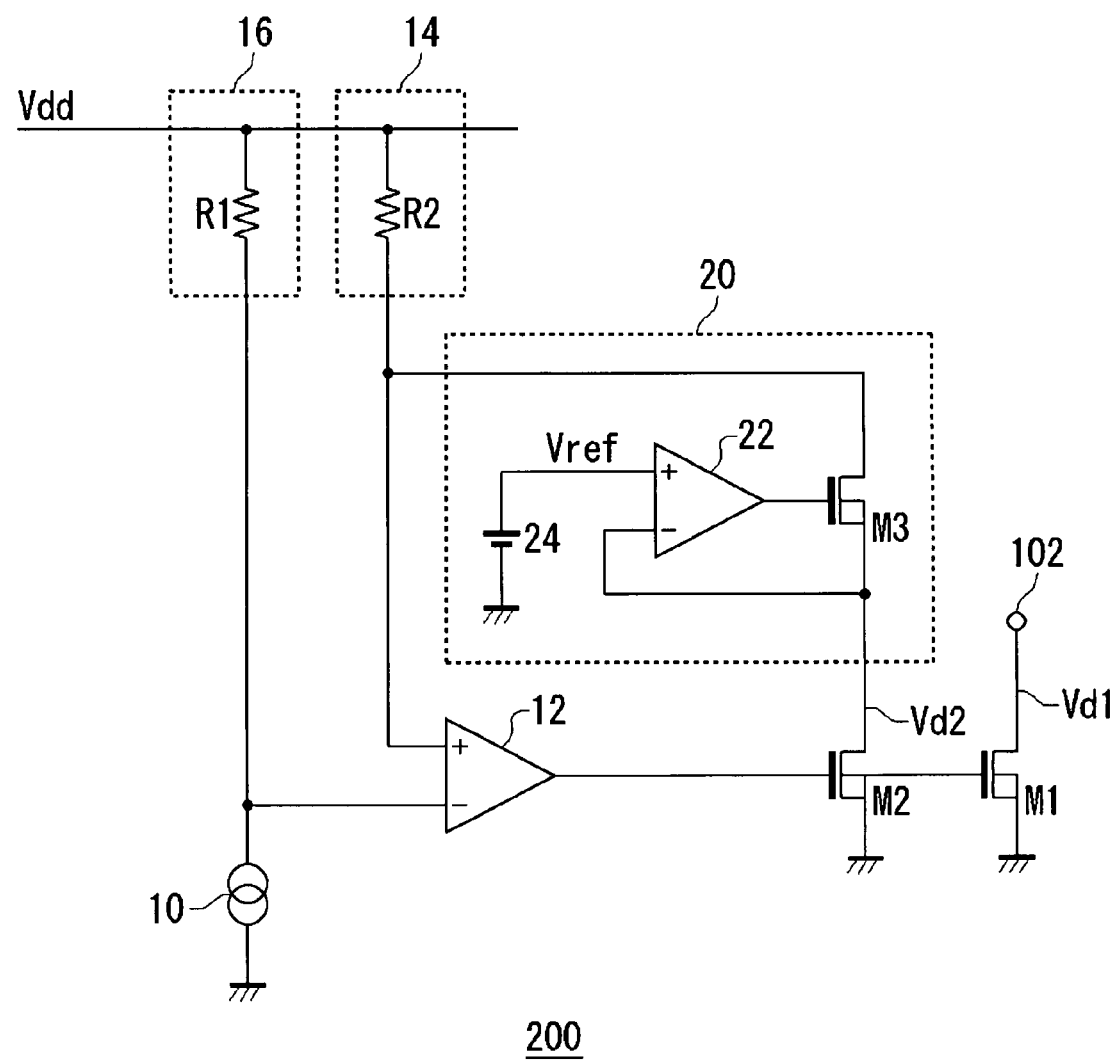
FIG. 2 is a circuit diagram showing a construction of a constant current circuit according to the second embodiment.

FIG. 2 is a circuit diagram showing a construction of the constant current circuit 200 according to the second embodiment. In the drawings that follow, constituent elements identical or equivalent to those of FIG. 1 will be denoted with identical numerals, and the description will not be suitably repeated.

The voltage adjusting unit 20 is connected between the drain terminal which is one end of the second transistor M2 and the second resistor R2, so as to adjust the drain voltage Vd2 of the second transistor M2 to be approximated to a predetermined reference voltage.

The voltage adjusting unit 20 includes a third transistor M3, a second error amplifier 22, and a reference voltage source 24, so as to constitute a regulator circuit.

The third transistor M3 is a MOSFET of N-type, and is connected in series to the second transistor M2. Namely, the source terminal of the third transistor M3 is connected to the drain terminal of the second transistor M2, and the drain terminal of the third transistor M3 is connected to the second resistor R2.

The reference voltage source 24 is a band gap reference circuit or the like, and generates a predetermined reference voltage Vref.

The reference voltage Vref generated by the reference voltage source 24 is input into the non-inverting input terminal of the second error amplifier 22. The voltage Vd2 at the connection point of the second transistor M2 and the third transistor M3, namely, the drain terminal of the second transistor M2, is input into the inverting input terminal. The output terminal of the second error amplifier 22 is connected to the gate terminal of the third transistor M3.

An operation of the constant current circuit 200 constructed in the above manner will be described. The constant current circuit 200 according to the present embodiment generates a constant current Ic proportional to the reference current Iref in the same manner as the constant current circuit 100 according to the first embodiment.

First, in order to make the effects obtained by the constant current circuit 200 according to the present embodiment be more definite, the characteristics of a conventional current mirror circuit will be described.

Figure 3:
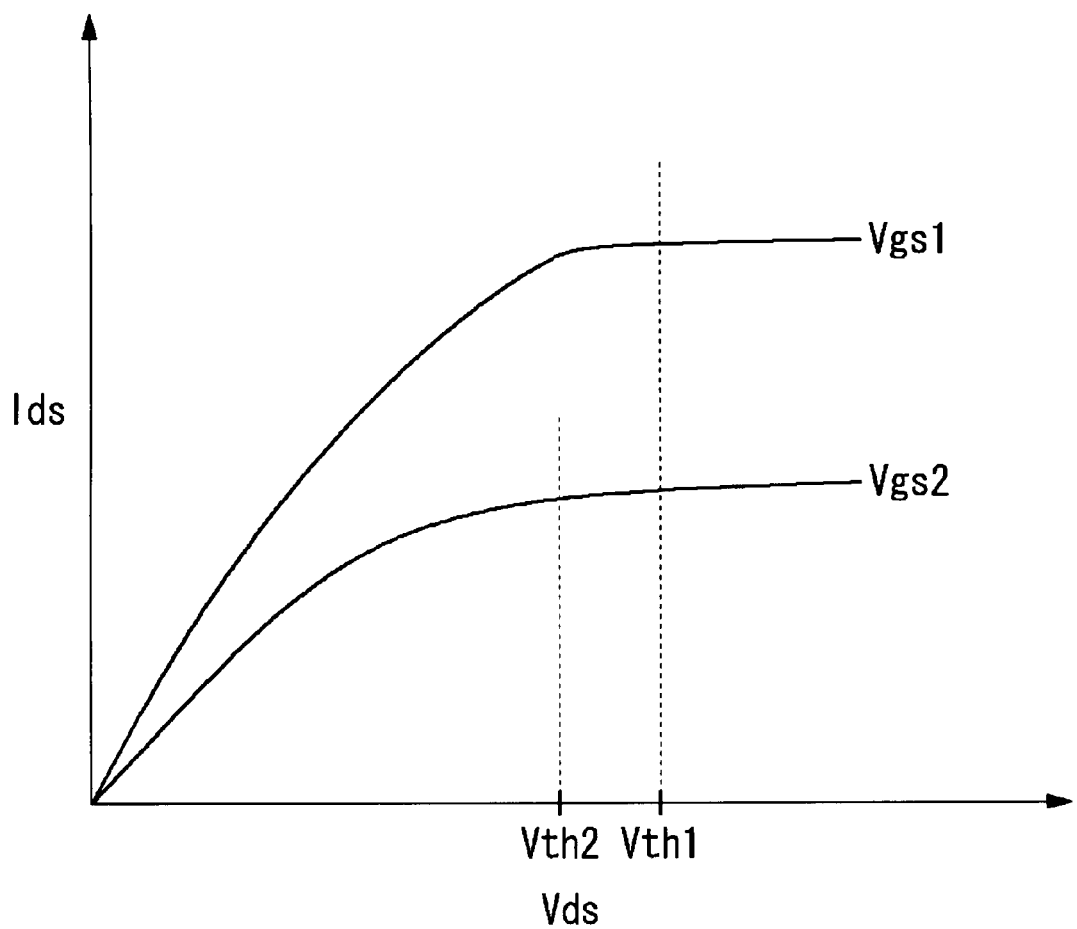
FIG. 3 is a view showing current-voltage characteristics of a MOSFET.

FIG. 3 shows current-voltage characteristics of a MOSFET. The lateral axis represents the drain-source voltage, and the longitudinal axis represents the drain-source current, where current-voltage characteristics relative to different gate-source voltages Vgs1, Vgs2 are shown. In the same Figure, the voltages Vth1, Vth2 show threshold value voltages between the constant current region and the non-constant current region respectively at the gate-source voltages Vgs1, Vgs2. As shown in the same Figure, in the non-constant current region (non-saturation region) in which the drain-source voltage is lower than the threshold value voltage Vth, the drain-source current greatly changes when the drain-source voltage changes.

Therefore, in a conventional current mirror circuit, when both of the two transistors operate in a constant current region, a current that accords with the size ratio of the transistors flows through each transistor; however, when one or both of the two transistors operate in a non-constant current region, the pair property of the transistors will be lost, so that a current that accords with the size ratio will not be generated.

Description will be returned to of the constant current circuit 200 according to the present embodiment.

As described above, in the voltage adjusting unit 20, in order that the voltages applied to the non-inverting input terminal and the inverting input terminal will be equal to each other, the second error amplifier 22 adjusts the gate voltage of the third transistor M3 which is the output thereof. As a result of this, the on-resistance of the third transistor M3 is adjusted, and a feedback is applied so that the reference voltage Vref and the drain voltage Vd2 of the second transistor M2 will be equal to each other.

As described above, when the drain-source voltages of the two transistors constituting a current mirror circuit differ from each other, it will not operate as an accurate current mirror circuit in a non-constant current region. However, in the case of the first transistor M1 and the second transistor M2 according to the present embodiment, the drain-source voltages of the two transistors can be made equal to each other owing to the presence of the voltage adjusting unit 20. For this reason, each transistor operates at an equal voltage for all of the three terminals, so that a current that accords with the size ratio can be flown even in a non-constant current region.

Now, when the value of the reference voltage Vref is set to be identical to the voltage Vd1 appearing at the current output terminal 102, almost the same voltages will be applied to the first transistor M1 and the second transistor M2 for all of the three terminals. In other words, the first transistor M1 and the second transistor M2 can generate a current proportional to the size of each transistor with a good precision even when they operate in a non-saturation region where the drain-source voltage is low.

The electric power consumed in the constant current circuit 200 will be reduced according as the drain-source voltage of the first transistor M1 and the second transistor M2 is lower. Here, when the value of the reference voltage Vref is set to be identical to the voltage Vd1 appearing at the current output terminal 102 as described above, a constant current can be generated with a good precision even when the first transistor M1 and the second transistor M2 are operated in a non-saturation region. Therefore, in the constant current circuit 200 according to the present embodiment, the power consumption of the constant current circuit 200 can be reduced by setting the reference voltage Vref and the voltage Vd1 appearing at the current output terminal 102 so that the second transistor M2 and the first transistor M1 will operate in a non-saturation region.

Also, in a conventional current mirror circuit, the drain-source voltage must be raised when the gate-source voltage of the first transistor M1 and the second transistor M2 is raised so as to drive the transistors fully. This is because the threshold value voltage Vth will be high when the gate-source voltage is raised as shown in FIG. 3.

In contrast to this, in the constant current circuit 200 according to the present embodiment, the drain-source voltage of each transistor, namely, the reference voltage Vref and the voltage Vd2 appearing at the current output terminal 102 can be set to be low because the pair property of the two transistors is maintained even when the gate-source voltage of the first transistor M1 and the second transistor M2 is raised so as to draw out the performance of the first transistor M1 and the second transistor M2 fully.

Third Embodiment

The third embodiment of the present invention is a light-emitting apparatus including a LED which is a light-emitting element.

Figure 4:
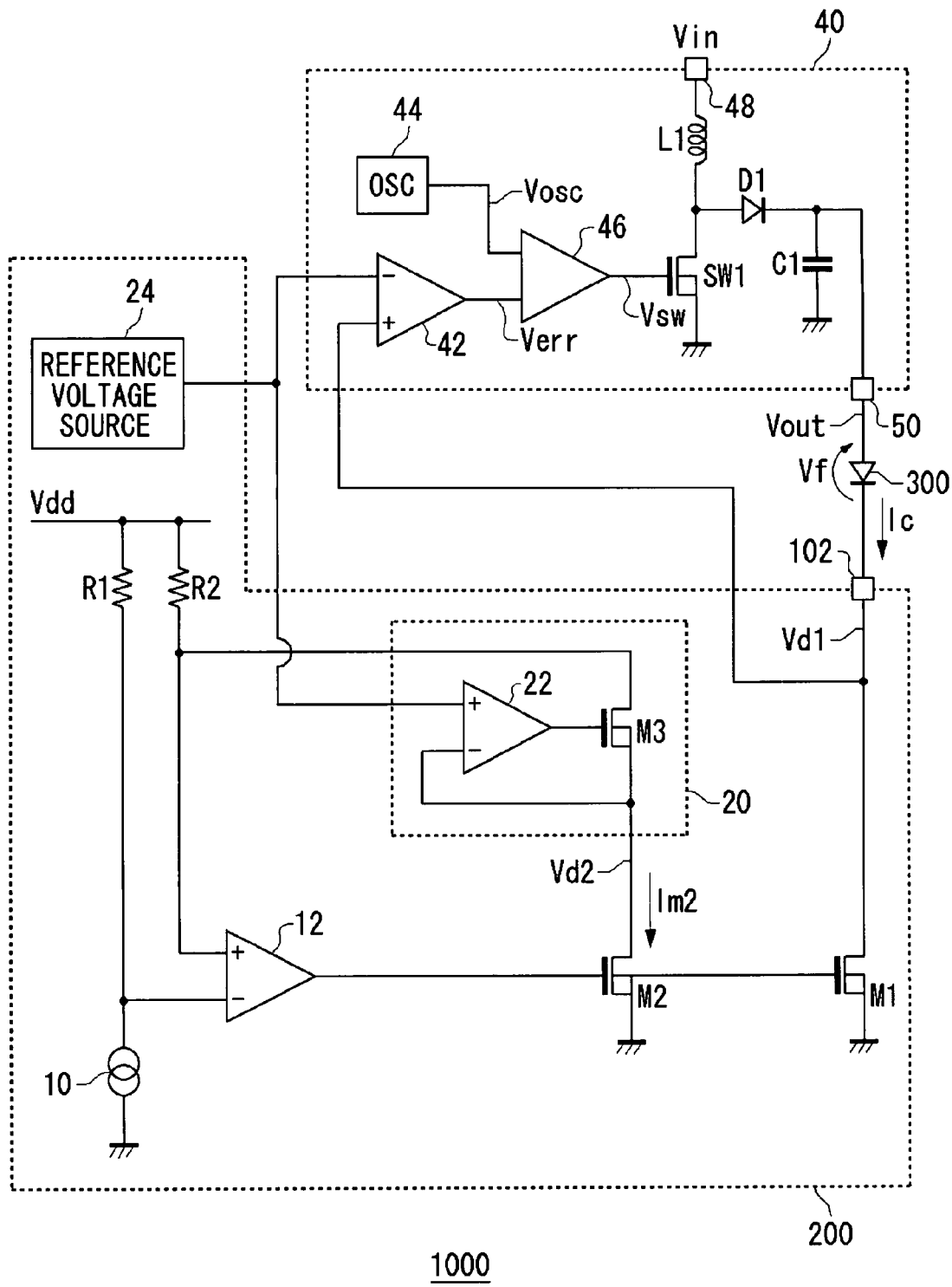
FIG. 4 is a circuit diagram showing a construction of a light-emitting apparatus according to the third embodiment.

FIG. 4 is a circuit diagram showing a construction of a light-emitting apparatus 1000 according to the third embodiment. The light-emitting apparatus 1000 includes a LED 300, a voltage generating unit 40, and a constant current circuit 200.

The cathode terminal of the LED 300 is connected to the current output terminal 102 of the constant current circuit 200. The luminescence brightness of the LED 300 is controlled by the constant current Ic generated by the constant current circuit 200. The output terminal 50 of the voltage generating unit 40 is connected to the anode terminal of the LED 300, and the output voltage Vout of the voltage generating unit 40 is applied.

The voltage generating unit 40 is a switching regulator, and the voltage Vout obtained by boosting the input voltage Vin that is input into the input terminal 48 is output from the output terminal 50. The voltage generating unit 40 includes a switching element SW1, a rectifying diode D1, an inductor L1, an output capacitor C1, a third error amplifier 42, an oscillator 44, and a voltage comparator 46.

The voltage Vd1 of the current output terminal 102 is input into the non-inverting input terminal of the third error amplifier 42. Also, the reference voltage Vref that is output from the reference voltage source 24 of the constant current circuit 200 is applied to the inverting input terminal. The third error amplifier 42 outputs an error voltage Verr obtained by amplifying the error voltage of the voltages Vd2, Vref. This error voltage Verr is input into the voltage comparator 46.

The oscillator 44 generates a periodic voltage Vosc having a triangular wave shape or a saw wave shape, and outputs it to the voltage comparator 46.

The voltage comparator 46 compares the error voltage Verr with the periodic voltage Vosc, and generates a switching signal Vsw that changes between the high level and the low level in accordance with the magnitude relationship thereof. The switching signal Vsw generated in this manner will be a signal that has been subjected to pulse width modulation in which the ratio of the periods of the high level and the low level, namely the duty ratio, changes.

This switching signal Vsw is input into the gate terminal of the MOSFET which is a switching element SW1, via a driver circuit not illustrated. The switching element SW1 is in an on-state while the switching signal Vsw is at the high level, and is in an off-state while the switching signal Vsw is at the low level.

By on and off of the switching element SW1, energy conversion is carried out by the inductor L1 and the output capacitor C1, whereby the input voltage applied to the input terminal 48 is boosted. The boosted voltage is smoothed by the output capacitor C1, and is output as an output DC voltage Vout. The output signal Vout generated by the voltage generating unit 40 in this manner is supplied to the LED 300 as a driving voltage.

An operation of the light-emitting apparatus 1000 constructed as shown above will be described.

A voltage of Vd1=Vout−Vf will appear at the current output terminal 102 of the constant current circuit 200 as a result of driving the LED 300 which is a load circuit. Here, Vf is the forward-direction voltage of the LED 300.

The switching signal Vsw in the voltage generating unit 40 is generated so that the two voltages Vref and Vd1 input into the third error amplifier 42 will be equal to each other. As a result of this, the output voltage Vout of the voltage generating unit 40 is stabilized so that Vout=Vd1+Vf=Vref+Vf holds.

At this time, in the constant current circuit 200, the voltage Vd2 of the drain terminal of the second transistor M2 is adjusted to be approximated to the reference voltage Vref by the voltage adjusting unit 20.

As a result of this, control is made so that the voltage Vd1 of the current output terminal 102 and the voltage Vd2 of the drain terminal of the second transistor M2 will be equal to each other.

In the constant current circuit 200 according to the present embodiment, the first transistor M1 and the second transistor M2 constitute a current mirror circuit, and adjustment is made so that the voltages of the drain terminal in addition to the gate terminal and the source terminal thereof will be equal. Therefore, the first transistor M1 can amplify the current Im2 flowing through the second transistor M2 with a good precision, and can flow the constant current Ic through the LED 300.

In the prior art, there has been a need to operate the first transistor M1 in a saturation region, so that the voltage appearing at the current output terminal 102 must be controlled to be, for example, 0.3 V or above.

In contrast, in the constant current circuit 200 according to the present embodiment, the first transistor M1 and the second transistor M2 maintain the pair property of the two transistors even in the non-saturation region as described in the second embodiment. As a result of this, in the constant current circuit 200 according to the present embodiment, the first transistor M1 can be operated in the non-saturation region, so that the reference voltage Vref can be set to be, for example, 0.1 V. As a result of this, electric power consumption in the first transistor M1 and the second transistor M2 can be reduced, and the efficiency of the light-emitting apparatus 1000 can be improved.

The above-described embodiments are exemplifications, and it will be understood by those skilled in the art that various modified examples can be made in the combination of the constituent elements and the processes thereof, and that those modified examples are also within the scope of the present invention.

Figure 5:
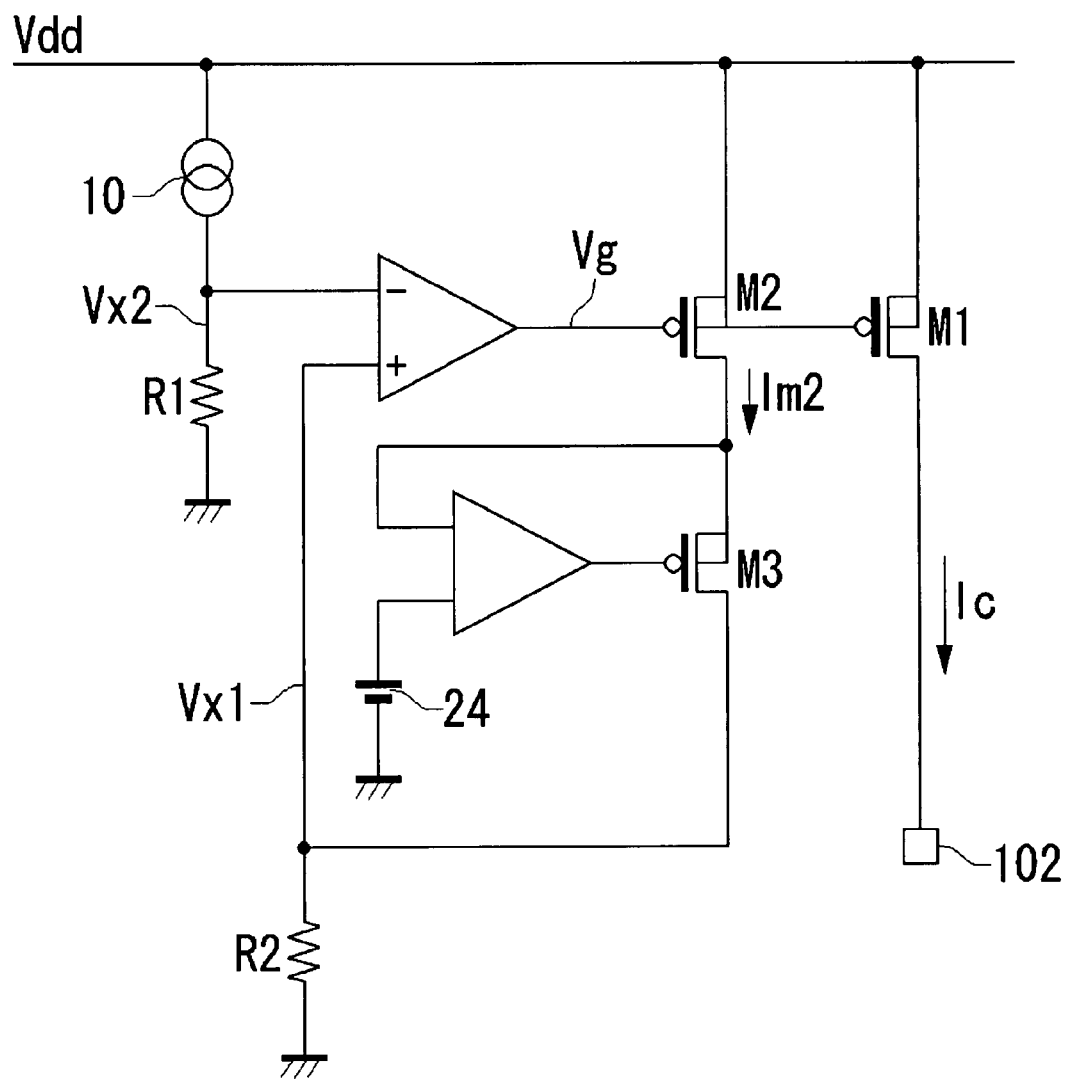
FIG. 5 is a circuit diagram showing a modified example of the constant current circuit according to the second embodiment.

FIG. 5 is a circuit diagram showing a modified example of the constant current circuit according to the second embodiment. The constant current circuit 600 according to the present modified example is constructed by substitution of N-type and P-type in the MOSFETs. According to this constant current circuit 600 also, a constant current Ic can be flown through a circuit connected to the current output terminal 102. The constant current circuit 600 according to the present modified example can be suitably used in a case in which the voltage drop of the circuit connected to the current output terminal 102 is small or in an electronic equipment in which a negative power source can be used.

In the embodiments, description has been made on a case in which each transistor is a MOSFET; however, transistors of other types such as a bipolar transistor may be used. The selection of these may be determined by the design specification demanded in the constant current circuit, the semiconductor production process to be used, and the like.

In the embodiments, all of the elements constituting the constant current circuit, the power supply apparatus, and others may be integrated, or alternatively a part thereof may be constructed with discrete components. Which part should be integrated may be determined according to the semiconductor production process to be used, the costs, the occupied area, and the like.

In the embodiments, description has been made assuming that the voltage generating unit 40 is a switching regulator; however, it may be a switching regulator of insulating type, a charge pumping circuit, a three-terminal regulator, or the like.

While the preferred embodiments of the present invention have been described using specific terms, such description is for illustrative purposes only, and it is to be understood that changes and variations may be made without departing from the spirit or scope of the appended claims.

The invention claimed is:

1. A constant current circuit that flows a constant current through a circuit connected to a current output terminal, comprising:
    a first transistor disposed on a current path of said constant current;
    a second transistor having a control terminal connected in common to that of said first transistor;
    a first current-voltage converting unit that converts a current flowing through said second transistor into a voltage;
    a constant current source that generates a reference current;
    a second current-voltage converting unit that converts said reference current into a voltage;
    a first error amplifier that receives an input of respective output voltages of said first and second current-voltage converting units, so as to adjust a voltage of the control terminals of said first and second transistors; and
    a voltage adjusting unit that is connected to one end of said second transistor and makes adjustments so that a voltage at the one end of the second transistor will be approximated to a predetermined reference voltage.

2. The constant current circuit according to claim 1, wherein
    said voltage adjusting unit comprises:
    a third transistor connected in series to said second transistor; and
    a second error amplifier that receives an input of a voltage of a connection point of said second and third transistors and said predetermined reference voltage, so as to adjust a voltage of a control terminal of said third transistor.

3. The constant current circuit according to claim 1, wherein said predetermined reference voltage is set to be identical to a voltage of said current output terminal.

4. The constant current circuit according to claim 3, wherein
    said predetermined reference voltage is set so that said second transistor may operate in a non-constant current region.

5. A power supply apparatus comprising:
    a constant current circuit that flows a constant current through a circuit connected to a current output terminal, the constant current circuit comprising;
        a first transistor disposed on a current path of said constant current;
        a second transistor having a control terminal connected in common to that of said first transistor;
        a first current-voltage converting unit that converts a current flowing through said second transistor into a voltage;
        a constant current source that generates a reference current;
        a second current-voltage converting unit that converts said reference current into a voltage; and
        a first error amplifier that receives an input of respective output voltages of said first and second current-voltage converting units, so as to adjust a voltage of the control terminals of said first and second transistors; and
    a voltage generating unit that supplies a driving voltage to a load circuit connected to the current output terminal of said constant current circuit, wherein
    said voltage generating unit generates said driving voltage so that a voltage appearing at the current output terminal of said constant current circuit may be approximated to a voltage at one end of said second transistor.

6. A light-emitting apparatus comprising:
    a light-emitting element; and
    a power supply apparatus that drives said light-emitting element, the power supply apparatus comprising:
        a constant current circuit that flows a constant current through a circuit connected to a current output terminal, the constant current circuit comprising:
            a first transistor disposed on a current path of said constant current;
            a second transistor having a control terminal connected in common to that of said first transistor;
            a first current-voltage converting unit that converts a current flowing through said second transistor into a voltage;
            a constant current source that generates a reference current;
            a second current-voltage converting unit that converts said reference current into a voltage; and
            a first error amplifier that receives an input of respective output voltages of said first and second current-voltage converting units, so as to adjust a voltage of the control terminals of said first and second transistors; and a voltage generating unit that supplies a driving voltage to a load circuit connected to the current output terminal of said constant current circuit, wherein said voltage generating unit generates said driving voltage so that a voltage appearing at the current output terminal of said constant current circuit may be approximated to a voltage at one end of said second transistor;

wherein a luminescence brightness of said light-emitting element is controlled by said reference current that is generated by the constant current source of said constant current circuit.

7. A constant current circuit that flows a constant current through a circuit connected to a current output terminal, comprising:

a first transistor disposed on a current path of said constant current;

a second transistor having a control terminal connected in common to that of said first transistor;

a first current-voltage converting unit that converts a current flowing through said second transistor into a voltage;

a constant current source that generates a reference current;

a second current-voltage converting unit that converts said reference current into a voltage;

a first error amplifier that receives an input of respective output voltages of said first and second current-voltage converting units, so as to adjust a voltage of the control terminals of said first and second transistors; and a voltage adjusting unit that is connected to one end of said second transistor and makes adjustments so that a voltage at the one end of the second transistor will be approximated to a voltage appearing at the current output terminal.

8. A constant current circuit that flows a constant current through a circuit connected to a current output terminal, comprising:

a first transistor disposed on a current path of said constant current;

a second transistor having a control terminal connected in common to that of said first transistor;

a first current-voltage converting unit that converts a current flowing through said second transistor into a voltage;

a constant current source that generates a reference current;

a second current-voltage converting unit that converts said reference current into a voltage; and a first error amplifier that receives an input of respective output voltages of said first and second current-voltage converting units, so as to adjust a voltage of the control terminals of said first and second transistors, wherein the current flowing through the second transistor is corresponded to resistance value of the first current-voltage converting unit, to resistance value of the second current-voltage converting unit, and to the reference current, and wherein the constant current through the circuit connected to the current output terminal is corresponded to the current flowing through the second transistor and to the size ratio of the first transistor and the second transistor.

9. The constant current circuit according to claim 8, wherein the constant current Ic through the circuit connected to the current output terminal is given as Ic=(R1/R2)×(S1/S2)×Iref, R1 being resistance value of the second current-voltage converting unit, R2 being resistance value of the first current-voltage converting unit, S1 being a transistor size of the first transistor, S2 being a transistor size of the second transistor, and Iref being current value of the reference current.

10. The constant current circuit according to claim 8, further comprising a voltage adjusting unit that is connected to one end of said second transistor and makes adjustments so that a voltage at the one end of the second transistor will be approximated to a predetermined reference voltage.

11. The constant current circuit according to claim 10, wherein said voltage adjusting unit comprises:

a third transistor connected in series to said second transistor; and a second error amplifier that receives an input of a voltage of a connection point of said second and third transistors and said predetermined reference voltage, so as to adjust a voltage of a control terminal of said third transistor.

12. The constant current circuit according to claim 10, wherein said predetermined reference voltage is set to be identical to a voltage of said current output terminal.

13. The constant current circuit according to claim 12, wherein said predetermined reference voltage is set so that said second transistor may operate in a non-constant current region.

14. A power supply apparatus comprising:

a constant current circuit that flows a constant current through a circuit connected to a current output terminal, the constant current circuit comprising:

a first transistor disposed on a current path of said constant current;

a second transistor having a control terminal connected in common to that of said first transistor;

a first current-voltage converting unit that converts a current flowing through said second transistor into a voltage;

a constant current source that generates a reference current;

a second current-voltage converting unit that converts said reference current into a voltage; and a first error amplifier that receives an input of respective output voltages of said first and second current-voltage converting units, so as to adjust a voltage of the control terminals of said first and second transistors, wherein the current flowing through the second transistor is corresponded to resistance value of the first current-voltage converting unit, to resistance value of the second current-voltage converting unit, and to the reference current, and wherein the constant current through the circuit connected to the current output terminal is corresponded to the current flowing through the second transistor and to the size ratio of the first transistor and the second transistor; and a voltage generating unit that supplies a driving voltage to a load circuit connected to the current output terminal of said constant current circuit, wherein said voltage generating unit generates said driving voltage so that a voltage appearing at the current output terminal of said constant current circuit may be approximated to a voltage at one end of said second transistor.

15. A light-emitting apparatus comprising:

a light-emitting element; and a power supply apparatus according to that drives said light-emitting element, the power supply apparatus comprising:
- a constant current circuit that flows a constant current through a circuit connected to a current output terminal, the constant current circuit comprising:
  - a first transistor disposed on a current path of said constant current;
  - a second transistor having a control terminal connected in common to that of said first transistor;
  - a first current-voltage converting unit that converts a current flowing through said second transistor into a voltage;
  - a constant current source that generates a reference current;
  - a second current-voltage converting unit that converts said reference current into a voltage; and
  - a first error amplifier that receives an input of respective output voltages of said first and second current-voltage converting units, so as to adjust a voltage of the control terminals of said first and second transistors,
  - wherein the current flowing through the second transistor is corresponded to resistance value of the first current-voltage converting unit, to resistance value of the second current-voltage converting unit, and to the reference current,
  - and wherein the constant current through the circuit connected to the current output terminal is corresponded to the current flowing through the second transistor and to the size ratio of the first transistor and the second transistor; and
- a voltage generating unit that supplies a driving voltage to a load circuit connected to the current output terminal of said constant current circuit,
  wherein said voltage generating unit generates said driving voltage so that a voltage appearing at the current output terminal of said constant current circuit may be approximated to a voltage at one end of said second transistor;
wherein a luminescence brightness of said light-emitting element is controlled by said reference current that is generated by the constant current source of said constant current circuit.

* * * * *